United States Patent
Deng et al.

(10) Patent No.: US 9,401,485 B2
(45) Date of Patent: Jul. 26, 2016

(54) FLEXIBLE DISPLAY SUBSTRATE, THE MANUFACTURING METHOD THEREOF AND A FLEXIBLE DISPLAY DEVICE

(71) Applicant: BOE TECHNOLOGY GROUP CO., LTD., Beijing (CN)

(72) Inventors: Wei Deng, Beijing (CN); Jianwei Yu, Beijing (CN); Zhuo Zhang, Beijing (CN); Xiaoxiong Tian, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/102,406

(22) Filed: Dec. 10, 2013

(65) Prior Publication Data
US 2014/0159046 A1 Jun. 12, 2014

(30) Foreign Application Priority Data
Dec. 10, 2012 (CN) .......................... 2012 1 0530448

(51) Int. Cl.
*H01L 27/15* (2006.01)
*H01L 31/12* (2006.01)
(Continued)

(52) U.S. Cl.
CPC ...... *H01L 51/0097* (2013.01); *G02F 1/133305* (2013.01); *H01L 27/1218* (2013.01);
(Continued)

(58) Field of Classification Search
CPC . H01L 27/32; H01L 27/3244; H01L 27/3248; H01L 51/50; H01L 2227/32
See application file for complete search history.

(56) References Cited

U.S. PATENT DOCUMENTS

2006/0278333 A1* 12/2006 Lee .................... G02F 1/133305
156/263
2008/0121415 A1 5/2008 Oh
2012/0243151 A1* 9/2012 Lynch ..................... 361/679.01

FOREIGN PATENT DOCUMENTS

| CN | 101493626 A | 7/2009 |
| CN | 202153541 U | 2/2012 |

(Continued)

OTHER PUBLICATIONS

First Office Action for corresponding Chinese Patent Application No. 201210530448.5, 20 pages (including English translation), (Sep. 3, 2014).

(Continued)

*Primary Examiner* — Hoai V Pham
(74) *Attorney, Agent, or Firm* — Blakely, Sokoloff, Taylor & Zafman LLP

(57) ABSTRACT

The present invention provides a flexible display substrate, the manufacturing method thereof and a flexible display device, relates to the field of flexible display technology, and can solve the technical problems that the existing flexible display substrate is easy to be damaged during deforming, has small amount of deformation, degraded display performance or high costs, or has difficulty in manufacturing process. The flexible display substrate according to the present invention comprising a hard material layer disposed at the fragile positions of the flexible display substrate. The manufacturing method for the flexible display substrate according to the present invention comprises forming a pattern of a hard material layer. The flexible display device of the present invention comprises the flexible display substrate mentioned above. The present invention is applicable to flexible display devices such as flexible organic electroluminescent display device, flexible electrophoretic display device, or liquid crystal display device.

11 Claims, 3 Drawing Sheets

(51) Int. Cl.
  *H01L 33/00* (2010.01)
  *H01L 51/00* (2006.01)
  *H01L 27/12* (2006.01)
  *H01L 51/52* (2006.01)
  *H01L 27/32* (2006.01)
  *G02F 1/1333* (2006.01)

(52) U.S. Cl.
  CPC .......... *H01L27/1248* (2013.01); *H01L 27/326* (2013.01); *H01L 51/52* (2013.01); *H01L 2251/5338* (2013.01); *Y02E 10/549* (2013.01)

(56) References Cited

FOREIGN PATENT DOCUMENTS

CN  102496684 A  6/2012
CN  102645810 A  8/2012

OTHER PUBLICATIONS

Second Office Action for corresponding Chinese Patent Application No. 201210530448.5, 6 pages, (Jan. 28, 2015).

* cited by examiner

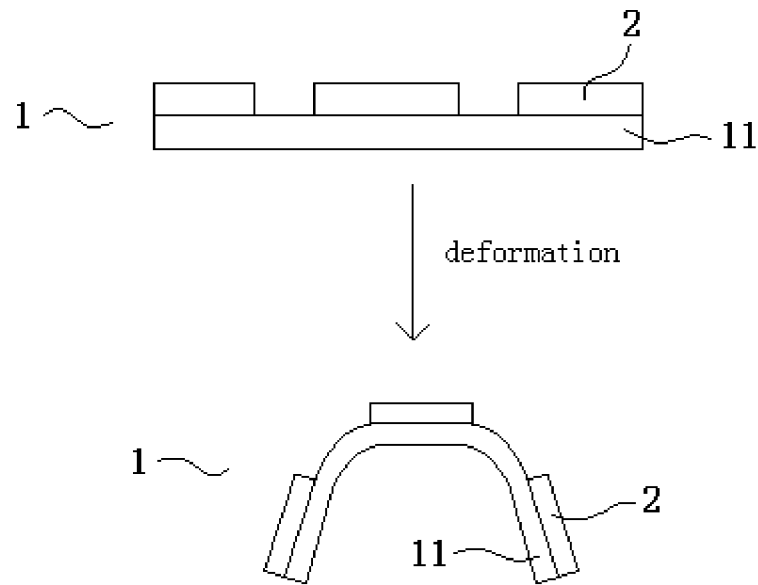
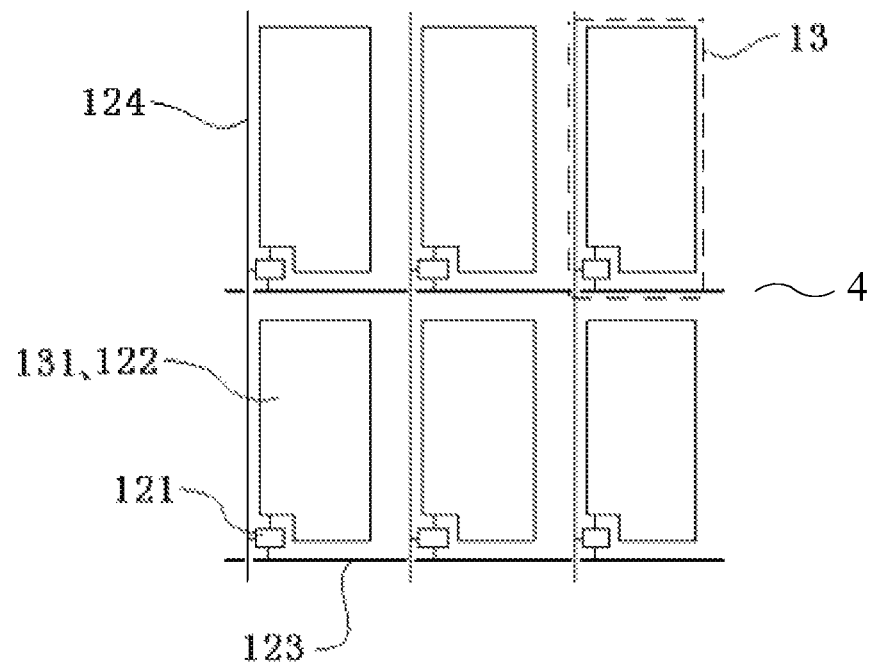
Fig. 1
Fig. 2

FLEXIBLE DISPLAY SUBSTRATE, THE MANUFACTURING METHOD THEREOF AND A FLEXIBLE DISPLAY DEVICE

TECHNICAL HELD

The present invention relates to the field of flexible display technology, and more particularly to a flexible display substrate, the manufacturing method thereof and a flexible display device.

BACKGROUND ART

The flexible display device is a display device of which the display substrate can be bent, and includes a flexible organic electroluminescent display device (OLED), a flexible electrophoretic display device (EPD), a flexible liquid crystal display device (LCD) and other types.

Different from conventional display device, a flexible display substrate (an array substrate, and a color filter substrate or the like) is used in the flexible display device. The base of the flexible display substrate can be made of bendable flexible material such as plastic, so that the display device can be bent. However, certain structures (e.g. thin film transistors, etc.) on the flexible display substrate have poor flexibility. They are easily to be failed or worn when the flexible display device is bending and cause the flexible display substrate damaged or degraded (such structures may be called the "fragile structure"). For example, when the active region of the thin film transistor is worn, thus generated signal will drift and defect will occur in display.

Meanwhile, even in the case where damage does not occur, deformation of some display structure may also cause display defects. For example, in the flexible liquid crystal display device, if the display area of the pixel cell is deformed, the orientation of corresponding liquid crystal molecules may be changed undesirably under the deformation stress, leading to display errors. For this, the existing flexible liquid crystal display device can withstand comparative low deformation under the premise of normal display.

To solve the above problem, the prior art mainly uses the following two methods:

One method is to use a flexible material which is easy to bend in various display structures in the flexible display devices, for example, using an oxide semiconductor (such as gallium indium zinc oxide, IGZO), or organic semiconductor (such as phthalocyanine copper, PcCu) instead of the silicon-based semiconductor material in the active region of the thin film transistor (TFT). However, not all of the display structures may be made from material with good flexibility, which limits the selection for material; and even if there are substitute materials, they may not achieve the performance, cost, and so on of existing materials, and the utility of substitute materials may result in degraded performance and increased costs of the flexible display device. Moreover, if substitute material is used, the structure, manufacturing process of the flexible display substrate will be changed significantly, and may not be obtained through existing processes and equipment.

The second method is to encapsulate various display structures on the flexible display substrate using an elastic material layer, to protect these structures from damage. However, while protecting the fragile structure, the elastic material layer may also limit the deformation of the flexible display substrate, resulting in a reduced deformation ability of the flexible display device.

Meanwhile, according to the above two methods, when the deformation occurs, the deformation extent (or curvature) of each part of the flexible display substrate are the same or similar; therefore neither of the two methods can overcome the undesirable display caused by deformation without damage (e.g. undesirable display due to undesirable orientation change in the liquid crystal material).

SUMMARY

The technical problem to be solved by the present invention includes that the existing flexible display substrate is easy to be damaged during deforming, has small amount of deformation, degraded display performance or high costs, or has difficulty in manufacturing process. The present invention provides a flexible display substrate which is not easily damaged, has large amount of deformation, good display performance, reduced costs and simple manufacturing process.

The technical solution to solve the technical problem of the invention is a flexible display substrate comprising: a hard material layer disposed at the fragile positions of the flexible display substrate.

The "flexible display substrate" refers to a substrate used in a flexible display device, such as the array substrate in a flexible organic electroluminescent display device, a flexible electrophoretic display device, or a flexible liquid crystal display device, the color filter substrate in a flexible liquid crystal display device, the protective substrate to be aligned with the array substrate in the flexible organic electroluminescent display device. The "hard material layer" refers to a layer formed by material with high hardness and is not apt to deform. The hardness of the hard material layer shall be larger than that of the base material of the flexible display substrate, and have enough thickness to significantly improve resistance to deformation at its location. "The hard material layer being disposed at the fragile positions of the flexible display substrate" means that when view from a direction perpendicular to the substrate, the hard material layer is provided only on the positions of the flexible display substrate where breakage is easy to occur.

The flexible display substrate of the present invention provides hard material layer at the fragile positions, such that a structure like "scales" is formed by the hard material layer. Thus formed flexible display substrate has a structure with hard and soft structures alternately disposed. When the flexible display substrate is bending, the deformation mainly occurs on areas without the hard material layer (in other words, the deformation is concentrated in the gaps among the "scales"). Because of the protective effect of the hard material layer to the fragile structure, if the hard material layer is provided there, the fragile structure can not be deformed or the deformation is small, therefore failure or wearing thereof can be avoided, and undesirable display caused by deformation without damage (e.g. undesirable display due to undesirable orientation change in the liquid crystal material) can also be avoided. The flexible display substrate of the present invention is not easily damaged, has large amount of deformation and good display performance; meanwhile, since the hard material layer can be formed through existing processes and equipment, such that the manufacturing equipments and process need no significant change, resulting in reduced costs.

Preferably, the flexible display substrate includes a plurality of pixel units, each of which having a display area for display; and the hard material layer is provided at the display area.

Each "pixel unit" refers to an area on the display device corresponding to a pixel (or sub-pixel); the "display area" refers to the visible region in a "pixel unit" when the "pixel unit" is displayed, such as an area in an organic electroluminescent display device where the anode is located, or an area in a liquid crystal display device where the pixel electrode is located and the like.

Preferably, the flexible display substrate is an array substrate comprising thin film transistors, pixel electrodes and lead wires, the hard material layer is provided in correspondence with at least one of the thin film transistor, the pixel electrode and the lead wires; and/or the flexible display substrate is a substrate to be aligned with the array substrate, and said substrate to be aligned with the array substrate is provided with the hard material layer at positions corresponding to at least one of the thin film transistors, the pixel electrodes and the lead wires of the array substrate.

The "array substrate" refers to a substrate having a thin film transistor array, other structures such as the pixel electrodes, anode, cathode, electroiuminescent layer, color filters, electrophoretic capsules can be formed on the array substrate. The "lead wires" refers to wires connected to the thin film transistors or other structures such as gate lines (scanning lines), source lines (data lines), the common electrode lines, the power supply (Vdd) lines etc. The "substrate to be aligned with the array substrate" refers to a substrate to be used with the array substrate to form a substrate of the flexible display substrate, e.g. the color filter substrate in the flexible liquid crystal display device and the protective substrate in the flexible organic electroluminescent display device and the like.

Preferably, the flexible display substrate comprising: a base and a display structure provided on the base for display, and the hard material layer is provided on said display structure, and/or the hard material layer is provided between the base and the display structure, and/or the hard material layer provided between the different layers within the display structure, and/or a particular functional layer in the display structure is the hard material layer, and/or the hard material layer is provided on one side of the display structure away from the display structure.

The "the display structure" refers to a structure in the flexible display substrate for display, including thin film transistors, lead wires, pixel electrodes, cathodes, anodes, an electroluminescent layer, electrophoretic capsules, black matrix, color filters, polarizing tablets and so on.

Preferably, the hard material layer is made of any one of hard photoresist, rigid plastic and rigid resin.

Preferably, the hard material layer provided on the display area is transparent.

Preferably, the flexible display substrate further comprises an elastic material layer, said elastic material layer corresponds to at least the areas of the flexible display substrate without the hard material layer.

The "elastic material layer" refers to a layer made of a material having a hardness lower than that of the hard material layer and is easily to be elastically deformed.

Further preferably, the elastic material layer is disposed on the whole flexible display substrate; or the elastic material layer is filled in positions among parts of the hard material layer.

It is further preferred that the elastic material layer is made of any one of soft photoresist, elastic plastic, elastic resin, elastic rubber or elastomeric polymer.

The technical problem to be solved by the present invention further includes that the existing flexible display substrate is easy to be damaged during deforming, has small amount of deformation, degraded display performance or high costs, or has difficulty in manufacturing process. The present invention provides a manufacturing method for the flexible display substrate which is not easily damaged, has large amount of deformation, good display performance, reduced costs and simple manufacturing process.

The technical solution to solve the technical problem of the invention is a manufacturing method for the flexible display substrate, said manufacturing method comprising: forming a pattern of a hard material layer at the fragile positions of the flexible display substrate.

The manufacturing method for the flexible display substrate according to the present invention comprises a step of forming the hard material layer at the fragile positions of the substrate. The prepared substrate is the above-mentioned flexible display substrate, therefore it is not easily to be damaged and have large amount of deformation, good display performance, reduced costs and simple manufacturing process.

Preferably, said forming a pattern of the hard material layer comprising forming the pattern of the hard material layer by any one of patterning process, inkjet print process and screen printing process.

The "patterning process" generally comprises the steps of photoresist coating, exposure, development, etching and photoresist peeling, which is known process to form specific pattern; when using the "patterning process" to form a photoresist pattern, the etching and photoresist peeling steps can be removed, leaving the remained photoresist to form a desired pattern.

Preferably, the manufacturing method of the flexible display substrate further comprises: forming a pattern of an elastic material layer on the base of the flexible display substrate.

Preferably, by performing different levels of exposure at different positions after complete coating of the photoresist, the patterns of the hard material layer and the elastic material layer are formed respectively.

The technical problem to be solved by the present invention further includes that the existing flexible display substrate is easy to be damaged during deforming, has small amount of deformation, degraded display performance or high costs, or has difficulty in manufacturing process. The present invention provides a flexible display device which is not easily damaged, has large amount of deformation, good display performance, reduced costs and simple manufacturing process.

The technical solution to solve the technical problem of the invention is a flexible display device comprising the flexible display substrate mentioned above.

The flexible display device of the present invention comprises the flexible display substrate mentioned above, therefore it is not easily to be damaged and have large amount of deformation, good display performance, reduced costs and simple manufacturing process.

The present invention is applicable to flexible display devices such as flexible organic electroluminescent display device, flexible electrophoretic display device, or liquid crystal display device.

BRIEF DESCRIPTION OF THE DRAWINGS

FIG. 1 is a principle schematic view of the deformation occurs in the flexible display substrate according to embodiment 1 of the present invention;

FIG. 2 is a plan view of the structure of the pixel units in the array substrate of the flexible display device according to embodiment 2 of the present invention;

REFERENCE NUMERALS

Figure 3:
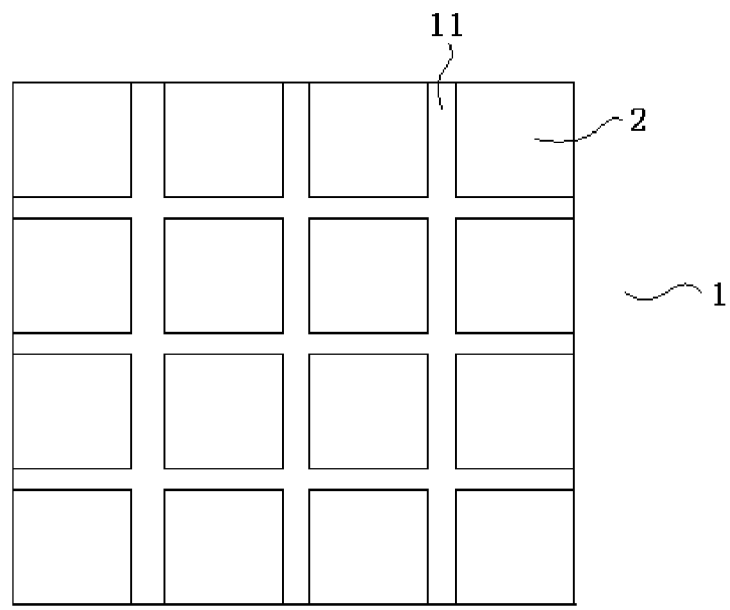
FIG. 3 is a plan view of the structure of a first flexible display substrate according to embodiment 2 of the present invention.

1—flexible display substrate; 11—base; 12—display structure; 121—thin film transistor; 122—pixel electrode; 123—gate line; 124—source line; 13—pixel unit; 131—display area; 2—hard material layer; 3—elastic material layer; 4—array substrate.

DETAILED DESCRIPTION OF THE PREFERRED EMBODIMENTS

For the person skilled in the art to better understand the technical solution of the present invention, the present invention is described in further detail in conjunction with the accompanying drawings and specific embodiments.

Embodiment 1

As shown in FIG. 1, the present embodiment provides a flexible display substrate 1 comprising a hard material layer 2 disposed at the fragile positions of the flexible display substrate 1.

The flexible display substrate 1 of the present embodiment is provided with hard material layer 2 at the fragile positions, such that a structure like "scales" is formed by the hard material layer 2. Thus formed flexible display substrate 1 has a structure with hard and soft structures alternatively disposed in whole. When the flexible display substrate 1 is bending, the deformation mainly occurs on areas without the hard material layer 2 (in other words, the deformation is concentrated in the gaps among the "scales"). Because of the protective effect of the hard material layer 2 to the fragile structure, if the hard material layer 2 is provided at the fragile positions, the fragile structure may not be deformed or the deformation is small, therefore failure or wearing thereof can be avoided, and undesirable display caused by deformation without damage (e.g. undesirable display due to undesirable orientation change in the liquid crystal material) can also be avoided. The flexible display substrate 1 of the present invention is not easily damaged, has large amount of deformation and good display performance; meanwhile, since the hard material layer 2 can be formed through existing processes and equipment, such that the manufacturing equipments and process need no significant change, resulting in reduced costs.

Embodiment 2

As shown in FIGS. 2-9, the present embodiment provides a flexible display substrate 1 comprising a base 11 and a display structure 12 provided on the base 11, and a hard material layer 2 is provided at the fragile positions of the flexible display substrate 1.

The display structure 12 includes thin film transistors 121, lead wires, pixel electrodes 122, cathodes, anodes, an electroluminescent layer, electrophoretic capsules, black matrix, color filters, and polarizing tablets and so on, which are located on the base 11 for display. The display structure 12 can be separated into multiple layers (e.g. the thin film transistor 121 has a gate layer, an insulating layer, a source/drain layer, an active layer and a passivation layer).

Because of the hard material layer 2 provided at the fragile position of the flexible display substrate 1 according to the present embodiment, when the flexible display substrate 1 is bending, deformation mainly occurs at areas without the hard material layer 2, while the areas provided with the hard material layer 2 do not deform or have small amount of deformation. Thus parts of the display structure 12 covered by the hard material layer 2 or parts of the display structure 12 located above the hard material layer 2 will not be damaged by deformation, or suffer undesirable display due to deformation.

Preferably, the hard material layer 2 can be made of any one of hard photoresist, rigid plastic or rigid resin.

The above-described hard materials are common materials with low costs, and can easily be formed into desired pattern by conventional process, and are therefore preferable; wherein the hard photoresist may be obtained by controlling exposure and curing of the photoresist.

Obviously, as shown in FIGS. 4 to 9, various display structures 12 may be disposed on the base 11, but the hard material layer 2 is not necessarily provided at all positions of the display structures 12. The hard material layer 2 is preferably provided at positions where the fragile structures are located, or where undesirable display is apt to occur due to deformation.

Preferably, as shown in FIG. 2, the flexible display substrate 1 may be an array substrate 4. In the array substrate 4 comprising the thin film transistors 121, pixel electrodes 122 and lead wires, the thin film transistors 121 have complex structure and high accuracy requirements, therefore they are fragile structures. Meanwhile, the lead wires (gate lines 123, the source lines 124, etc.) generally extend longer in the transverse or longitudinal directions, and are easily to be broken when the screen is curved if using certain materials with not good enough flexibility, in this situation the lead wires may become the fragile structures. In view of above, the hard material layer 2 is provided at the thin film transistors 121 and/or lead wires of the array substrate 4 (not shown). Besides, the pixel electrodes 122 are typically made of indium tin oxide (ITO) with poor flexibility, and are also fragile structures; therefore, the hard material layer 2 may also be provided at (corresponding areas of) the pixel electrodes 122.

Of course, other positions of the array substrate 4 may be provided with the hard material layer 2, e.g. the anodes of the array substrate in a flexible electroluminescent display device may be provided with the hard material layer 2.

As mentioned above, the array substrate 4 may be aligned with other substrate (the color filter substrate in a flexible liquid crystal display device, the protective substrate in the flexible organic electroluminescent display device, which are flexible substrates) to form a display panel. The hard material layer 2 may be provided at positions on the substrate (the color filter substrate or the protective substrate) corresponding to the fragile structures (e.g. at least one of the thin film transistors 121, pixel electrodes 122 and lead wires) on the array substrate 4. Thus, after aligned with the array substrate 4, the hard material layer 2 can also prevent the positions of the thin film transistors 121, pixel electrodes 122 and lead wires from deformation.

Obviously, providing the hard material layer 2 on the array substrate 4 and the substrate to be aligned with the array substrate 4 respectively is allowable. For example, after providing the hard material layer 2 at the thin film transistors 121 of the array substrate, the hard material layer 2 may also be provided at the corresponding position on the substrate to be aligned with the array substrate. Moreover, if the substrate to be aligned with the array substrate has fragile structures on itself, the hard material layer 2 may be also provided at the fragile structures. Of course, the application range of the hard material layer 2 is not limited to the array substrate. For example when two flexible display substrates are aligned with each other, the hard material layer 2 provided on one flexible display substrate can also protect the fragile structures on corresponding positions on the other flexible display substrate.

Preferably, as shown in FIG. 2, the array substrate 4 includes a plurality of pixel units 13, each pixel unit 13 has a display area 131 for display, and a hard material layer 2 is provided at the display area 131.

Various flexible display substrates 1 may be divided into a plurality of pixel units 13, the pixel units 13 are arranged in array and each corresponds to a pixel (or sub-pixel) of the display device. In each of the pixel units 13, a part of the area visible in display is called a display area 131 (such as the area where the anode in the organic electroluminescent display device is located, or the area where of the pixel electrode 122 in the liquid crystal display device is located, etc.), the remaining area is not visible in display (such as the area where the pixel defining layer in the organic electroluminescent display device is located, or the area where the black matrix in the liquid crystal display device is located, etc.).

On one hand, the display area 131 has many fragile structures (such as the pixel electrode 122 and the anode); on the other hand, in some cases, if the display area 131 is deformed, undesirable display may occur. For example in the flexible liquid crystal display device, if the display area 131 is deformed, the liquid crystal material corresponding to the display area 131 will take undesirable orientations under the effects of deformation stress, leading to display errors. Therefore it is preferable to provide the hard material layer 2 at the display area 131, whereby the fragile structures in the display area 131 can be prevented to be damaged while providing better display effects. Of course, the hard material layer 2 may be provided at the display area 131 while being provided at other positions on the flexible display substrate 1.

Further, since the display areas 131 are evenly distributed in a form like a matrix, thus the hard material layer 2 may be provided at the display areas 131 so that the hard material layer 2 may be distributed evenly like the "scales", and make the deformation more even.

Above is only part of the specific examples of positions of the hard material layer 2. Persons skilled in the art can determine the location of the hard material layer 2 according to the specific type and structure of the flexible display substrate 1.

Figure 4:
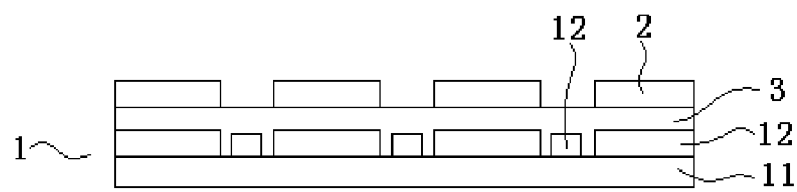
FIG. 4 is a side view of the structure of a second flexible display substrate according to embodiment 2 of the present invention.
Figure 5:
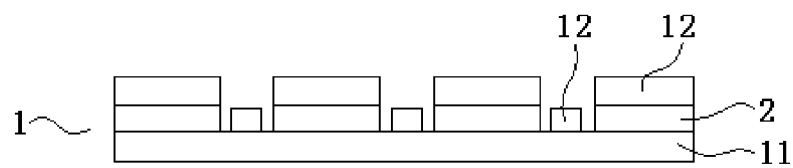
FIG. 5 is a side view of the structure of a third flexible display substrate according to embodiment 2 of the present invention.
Figure 6:
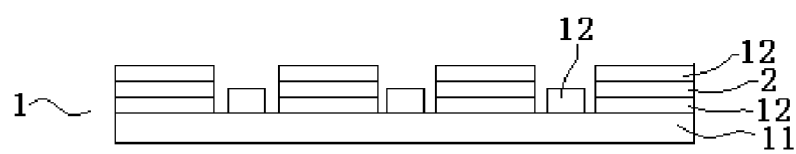
FIG. 6 is a side view of the structure of a fourth flexible display substrate according to embodiment 2 of the present invention.
Figure 7:
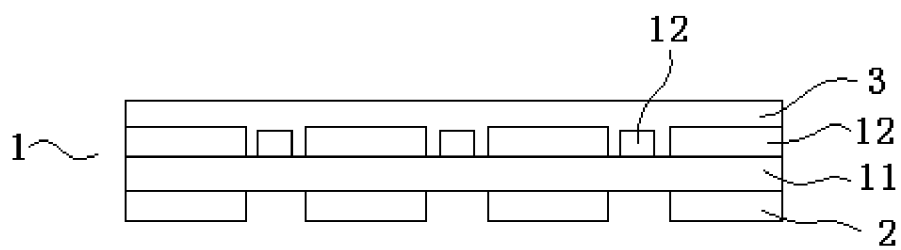
FIG. 7 is a side view of the structure of a fifth flexible display substrate according to embodiment 2 of the present invention.
Figure 8:
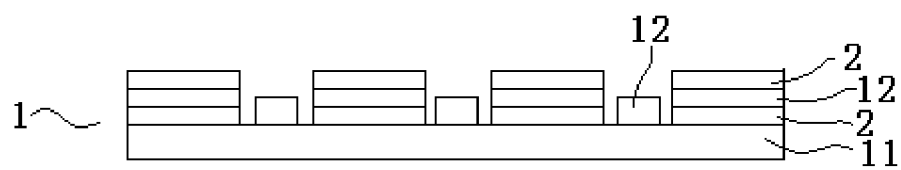
FIG. 8 is a side view of the structure of a sixth flexible display substrate according to embodiment 2 of the present invention.

Preferably, the hard material layer 2 may be located at different positions in the thickness direction of the flexible display substrate 1. For example, as shown in FIG. 4, the hard material layer 2 is located above (not necessarily adjacent to) the display structure 12; or, as shown in FIG. 5, the hard material layer 2 is located between the display structure 12 and the base 11; or, as shown in FIG. 6, the hard material layer 2 is located between different layers of the display structure 12 (e.g. between the active layer and the insulating layer of the thin film transistors 121); or, the hard material layer 2 may be a particular functional layer in the display structure 12 (e.g. the insulating layer, the passivation layer in the thin film transistors 121, and so on), that is, the material, manufacturing process (to change the cross linking level), thickness and the like of certain original functional layer in the display structure 12 may be changed to function as the hard material layer 2; or, as shown in FIG. 7, the hard material layer 2 may be located on the side of the base 11 away from the display structure 12. Of course, the hard material layer 2 may be provided at multiple positions mentioned above, e.g. as shown in FIG. 8, the hard material layers 2 are provided at both upper and lower sides of the display structure 12 (that is to say the display structure 12 is "sandwiched" between the hard material layers 2).

Regardless of on which side of the flexible display substrate 1 the hard material layer 2 is provided, the hard material layer 2 can reduce the deformation amount at the location of the hard material layer 2 on the flexible display substrate 1, so as to protect the display structure 12 at that location from damage due to deformation. The hard material layer 2 is preferably provided on the display structure 12, such that the display structure 12 can be protected from deformation while being encapsulated to achieve a better protection effect.

Figure 9:
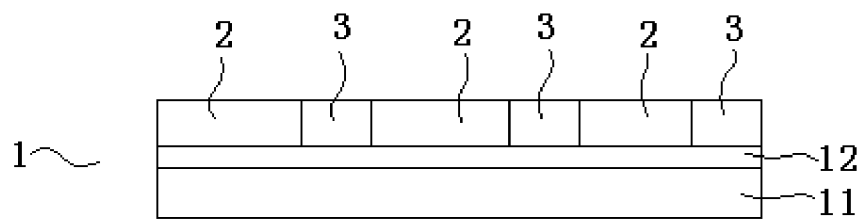
FIG. 9 is a view of the structure of a seventh flexible display substrate according to embodiment 2 of the present invention.

Preferably, as shown in FIGS. 4, 7 and 9, the flexible display substrate 1 of the present embodiment further comprises an elastic material layer 3. The elastic material layer 3 corresponds to at least the areas on the flexible display substrate where the hard material layer 2 is not provided.

That is, in the present embodiment, the flexible display substrate may also be encapsulated using the elastic material layer 3 so as to better protect various display structures.

Preferably, the elastic material layer 3 is made of any one of soft photoresist, elastic plastic, elastic resin, elastic rubber or elastomeric polymer.

The above-described elastic materials are common materials with low costs, and may be formed into desired pattern by conventional process, and are therefore preferable.

Preferably, as shown in FIGS. 4 and 7, the elastic material layer 3 is provided on the whole flexible display substrate 1. That is, the elastic material layer 3 completely covers at least one side of the flexible display substrate 1, which is typically located on the display structure 12 to provide protection. The hard material layer 2 may be provided on the elastic material layer 3 as shown in FIG. 4, or be covered by the elastic material layer 3, or be provided at one side of the base 11 away from the elastic material layer 3 as shown in FIG. 7. Since the elastic material layer 3 is complete, the manufacturing process thereof is simple, such as forming a complete layer by coating, depositing rather than performing patterning process.

Preferably, as shown in FIG. 9, the elastic material layer 3 is filled in the positions among parts of the hard material layer 2.

That is, the elastic material layer 3 is provided in the gaps among parts of the hard material layer 2, so as to form a complete layer structure with the hard material layer 2, to compose a protective layer. This protective layer has even thickness, which is advantageous to enhance the deformation ability of the flexible display substrate 1. The soft photoresist and the hard photoresist may be made of the same photoresist material, and subjected to different exposure and curing to obtain different hardness. If the hard material layer 2 and the elastic material layer 3 are made of photoresist, after a complete photoresist layer is coated, the photoresist at different locations may be subjected to different levels of exposure (e.g. using two-tone mask plate), the layer structure mentioned above can be directly obtained through simple process.

Further, the elastic material layer 3 is not necessary, the flexible display substrate 1 can be made without the elastic material layer 3.

Obviously, the flexible display substrate 1 in the present embodiment is only part of the examples, other type of flexible display substrate 1 can be applicable or other display structure 12 can be provided thereon. Besides, no matter the locations of the hard material layer 2 and the elastic material layer 3 in the embodiment, the display function of the elastic material layer 3 shall not be affected. For example, if the hard material layer 2 and the elastic material layer 3 are provided at the pixel electrode 122 of the array substrate in the flexible display substrate, they should be transparent.

Embodiment 3

The present embodiment provides a manufacturing method of the flexible display substrate, the method comprises: forming a pattern of the hard material layer at the fragile positions of the flexible display substrate.

The manufacturing method of the flexible display substrate according to the present embodiment comprises a step of forming hard material layer at the fragile positions of the substrate. The prepared substrate is the flexible display substrate in the above embodiment, therefore it is not easily to be damaged and have large amount of deformation, good display performance, reduced costs and simple manufacturing process.

Preferably, said forming a pattern of the hard material layer comprising forming the pattern of the hard material layer by any one of patterning process, inkjet print process and screen printing process.

The "patterning process" generally comprises the steps of photoresist coating, exposure, development, etching and photoresist peeling, which is known process to form specific pattern; when using the "patterning process" to form a photoresist pattern, the etching and photoresist peeling steps may be removed, leaving the remained photoresist to form a desired pattern.

Preferably, the manufacturing method of the flexible display substrate according to the present embodiment further comprises: forming a pattern of the elastic material layer on the base of the flexible display substrate.

If the elastic material layer is a complete film layer, then it may be formed directly by coating, depositing and so on; and if the elastic material layer is only located positions other than the fragile positions, it may be formed by patterning process, inkjet print process and screen printing process.

Particularly, if the hard material layer and the elastic material layer are both made of photoresist, they may be formed through the same patterning process, i.e. firstly coating a complete photoresist layer, and then the photoresist at different locations may be subjected to different levels of exposure (e.g. using two-tone mask plate) so that the hard material layer and the elastic material layer are formed at different locations, respectively.

Obviously, the manufacturing method of the flexible display substrate according to the present embodiment further includes the steps of forming the display structure; since this is the existing technology, detailed description thereof is omitted here. Besides, the order of the steps of forming the hard material layer, the elastic material layer and the display structure described above is not limited, and be determined depending on the structure of the product to be produced.

Embodiment 4

The present embodiment provides a flexible display device comprising the flexible display substrate according to any one the embodiments mentioned above.

The flexible display device of the present embodiment comprises the flexible display substrate mentioned above, therefore it is not easily to be damaged and have large amount of deformation, good display performance, reduced costs and simple manufacturing process.

It is readily understood that the foregoing embodiments are merely exemplary embodiments to illustrate the principles of the present invention, but the present invention is not limited thereto. Various modifications and variations are apparent to those skilled in the art without departing from the scope and spirit of the present invention, and such variations and modifications also drops within the scope of the present invention.

What is claimed is:

1. A bendable flexible display substrate comprising a hard material layer disposed at only positions of fragile structures of the flexible display substrate, wherein the fragile structures comprises at least one of thin film transistors, pixel electrodes, and lead wires.

2. The bendable flexible display substrate according to claim 1, comprising a plurality of pixel units, each of which having a display area for display; and the hard material layer is provided at the display area.

3. The bendable flexible display substrate according to claim 1, wherein:
the bendable flexible display substrate is an array substrate; or
the bendable flexible display substrate is a substrate to be aligned with the array substrate.

4. The bendable flexible display substrate according to claim 1, further comprising:
a base and a display structure provided on the base for display, and
the hard material layer is provided on said display structure, and/or
the hard material layer is provided between the base and the display structure, and/or
the hard material layer is provided between the different layers within the display structure, and/or
a particular functional layer in the display structure is the hard material layer, and/or
the hard material layer is provided on one side of the display structure away from the display structure.

5. The bendable flexible display substrate according to claim 1, wherein
the hard material layer is made of any one of hard photoresist, rigid plastic and rigid resin.

6. The bendable flexible display substrate according to claim 2, wherein the hard material layer that is provided on the display area is transparent.

7. A flexible display device comprising:
a bendable flexible display substrate comprising a hard material layer disposed at only positions of fragile structures of the flexible display substrate, wherein the fragile structures comprises at least one of thin film transistors, pixel electrodes, and lead wires.

8. The flexible display device according to claim 7, wherein the bendable flexible display substrate comprises a plurality of pixel units, each of which having a display area for display; and the hard material layer is provided at the display area.

9. The flexible display device according to claim 7, wherein:
   the bendable flexible display substrate is an array substrate; or
   the bendable flexible display substrate is a substrate to be aligned with the array substrate.

10. The flexible display device according to claim 7, wherein the bendable flexible display substrate further comprises:
   a base and a display structure provided on the base for display, and
   the hard material layer is provided on said display structure, and/or
   the hard material layer is provided between the base and the display structure, and/or
   the hard material layer is provided between the different layers within the display structure, and/or
   a particular functional layer in the display structure is the hard material layer, and/or
   the hard material layer is provided on one side of the display structure away from the display structure.

11. The flexible display device according to claim 10, wherein
   the hard material layer is made of any one of hard photoresist, rigid plastic and rigid resin.

* * * * *